United States Patent [19]
Drost et al.

[11] Patent Number: 5,485,106
[45] Date of Patent: Jan. 16, 1996

[54] ECL TO CMOS CONVERTER

[75] Inventors: Robert J. Drost, Santa Clara; David M. Murata, San Jose; Robert J. Bosnyak, Sunnyvale; Mark R. Santoro, Sunnyvale; Lee S. Tavrow, Sunnyvale, all of Calif.

[73] Assignee: Sun Microsystems, Inc., Mountain View, Calif.

[21] Appl. No.: 222,988

[22] Filed: Apr. 5, 1994

[51] Int. Cl.[6] .................. H03K 19/0175; H03K 19/082; H03K 19/0948

[52] U.S. Cl. .................. 326/66; 326/18; 326/85; 326/110

[58] Field of Search .................. 326/66, 64, 17–18, 326/84–85, 109–110, 126

[56] References Cited

U.S. PATENT DOCUMENTS

| | | | |
|---|---|---|---|
| 4,516,039 | 5/1985 | Matsuzaki et al. | 326/126 |
| 4,864,159 | 9/1989 | Cornelisson | 326/66 |
| 4,999,519 | 3/1991 | Kitsukawa et al. | 326/126 |
| 5,043,600 | 8/1991 | Horiuchi | 326/110 |
| 5,068,551 | 11/1991 | Bosnyak . | |
| 5,075,579 | 12/1991 | Ueno | 326/64 |
| 5,173,624 | 12/1992 | Gabillard | 326/66 |
| 5,315,179 | 5/1994 | Pelley, III et al. | 326/66 |

OTHER PUBLICATIONS

Horenstein, Mark. *Microelectronic Circuits And Devices*. Prentice Hall: New Jersey, 1990. pp. 778–785.
"Microelectronics Digital and Analog Circuits and Systems" by Jacob Millman, 1979, pp. 529–546.

*Primary Examiner*—Edward P. Westin
*Assistant Examiner*—Jon Santamauro
*Attorney, Agent, or Firm*—Kang S. Lim

[57] ABSTRACT

An efficient high-speed ECL to CMOS logic converter for BiCMOS integrated circuits. In one embodiment, a differential amplifier compares an ECL input signal to an ECL reference voltage and generates a pair of complementary intermediate signals on a corresponding pair of differential output nodes. The differential amplifier has two load resistors coupled in series with a common load resistor which limits the upper voltage swing at the differential output nodes. A regenerative stage coupled to the differential output nodes switches between a partially on state and a fully on state in response to the complementary intermediate signals. A pair of inverter stages convert the complementary intermediate signals into a pair of CMOS level signals. A pair of complementary output drivers coupled to the respective complementary inverter stages provide current driving capability. In this embodiment, each output driver includes a CMOS inverter pair and a bipolar transistor coupled between the respective output node of the driver and $V_{DD}$.

19 Claims, 3 Drawing Sheets

ECL TO CMOS CONVERTER

BACKGROUND OF THE INVENTION

1. Field of the Invention

This invention relates to combined bipolar and CMOS (BiCMOS) semiconductor integrated circuits (ICs). More particularly, the invention relates to a circuit for converting emitter coupled logic (ECL) levels to complementary metal oxide semiconductor (CMOS) logic levels for BiCMOS applications.

2. Description of the Related Art

BiCMOS technology combines the speed advantage of bipolar circuitry with the low power consumption advantage of CMOS circuitry. Conventional ECL and CMOS circuits on a BiCMOS IC may have the same operating voltage range, but they may have differing voltage rages with respect to their high and low logic levels. Accordingly, the presence of both ECL and CMOS circuitry on the BiCMOS IC necessitates the use of internal ECL to CMOS converters.

For example, a typical ECL circuit operates within five volt differential range (+5 to 0.0 volts), with 5 and 4.5, 4.2 and 3.7, 3.4 and 2.9, 2.8 and 2.3 representing pairs of typical logic low and logic high voltage levels, respectively. The selected voltage values depend on supply voltage, temperature, and process conditions. In contrast, a typical CMOS circuit operates within a 3.3 volt differential range, with 3.3 and 0 volts representing logic high and low levels, respectively.

U.S. Pat. No. 5,068,551 discloses an ECL to CMOS converter wherein an ECL logic circuit is coupled through a pair of emitter followers to the corresponding input nodes of a translation circuit. The translation circuit includes two pairs of crossed-coupled N-channel transistors. The complementary output nodes of the translation circuit are coupled to a corresponding pair of PMOS transistors. A refresh circuit which includes two CMOS inverters having cross-coupled input and output nodes, is also coupled to the complementary output nodes of the converter.

The operation of the '551 logic converter is as follows. The two emitter followers supply a pair of complementary ECL output signals to the complementary input nodes of the translation circuit. In response, the translation circuit turns the appropriate PMOS transistor on, thereby presenting a high CMOS logic level at the corresponding output node of the converter.

The high output signal at the one of the output nodes of the logic converter drives the corresponding input node of the refresh circuit high, causing the refresh circuit to latch, and regeneratively driving and maintaining both complementary output voltages at the output nodes of the converter.

The ECL to CMOS translator disclosed by the '551 patent has a number of deficiencies. Only one of two PMOS transistors coupled between the translation circuit and the output nodes of the converter is turned on during switching, i.e., the corresponding PMOS transistor is off. A full voltage swing of both PMOS transistors is required before the ECL to CMOS converter can switch to the opposite state. As such, the switching time of the converter circuitry is relatively slow. This problem is compounded by the refresh circuitry which imposes an additional load on the output nodes and further slows down the switching speed of the prior art converter.

SUMMARY OF THE INVENTION

The present invention provides a fast ECL to CMOS converter. The converter includes an ECL differential amplifier, a regenerative stage and an output stage. The ECL differential amplifier receives and compares an ECL input signal with an ECL reference voltage. The inputs of the regenerative stage is driven by the differential amplifier. The regenerative stage has an opposing pair of pull-down portions which toggles between a partially on and a fully on state. Each pull-down portion includes a pair of diodes coupled in series with an NMOS transistor. The control nodes of the opposing transistors are cross-coupled to the junction between the opposing pair of diodes. The toggling of the pull-down portions is accomplished by selecting appropriate values for the load resistors and the current source of the differential amplifier, thereby limiting the voltage swing at the control nodes of the transistors.

In some embodiments, a common load resistor is coupled between the load resistors of the differential amplifier and $V_{CC}$ to ensure that the output voltage of the differential amplifier does not rise to $V_{CC}$ during operation. This aspect of the invention advantageously protects the transistors of the next stage from excessive voltages.

In another embodiment, the converter also includes a pair of complementary inverter stages coupled between the regenerative stage and the output stage. Where speed and, hence, the current driving capability of inverter stages is an important consideration, the inverter stages are duplicated, thereby forming a second identical pair of inverter stages which provide a corresponding pair of complementary output signals for driving the output stage.

The ECL to CMOS converter of the present invention has a number of advantages over the prior art. By ensuring that the pull-down portions of the regenerative stage remain at least partially on during operation, the standby (non-switching states) current consumption of the converter is optimized with respect to its switching speed. In addition, the symmetry of the converter, e.g., the inverter stages, provide complementary inputs for the output stage. Accordingly, the present invention provides an elegant, low-power and high-speed ECL to CMOS converter for BiCMOS circuitry.

DESCRIPTION OF THE DRAWINGS

The objects, features and advantages of the system of the present invention will be apparent from the following description in which.

DESCRIPTION OF THE PREFERRED EMBODIMENT

Figure 1:
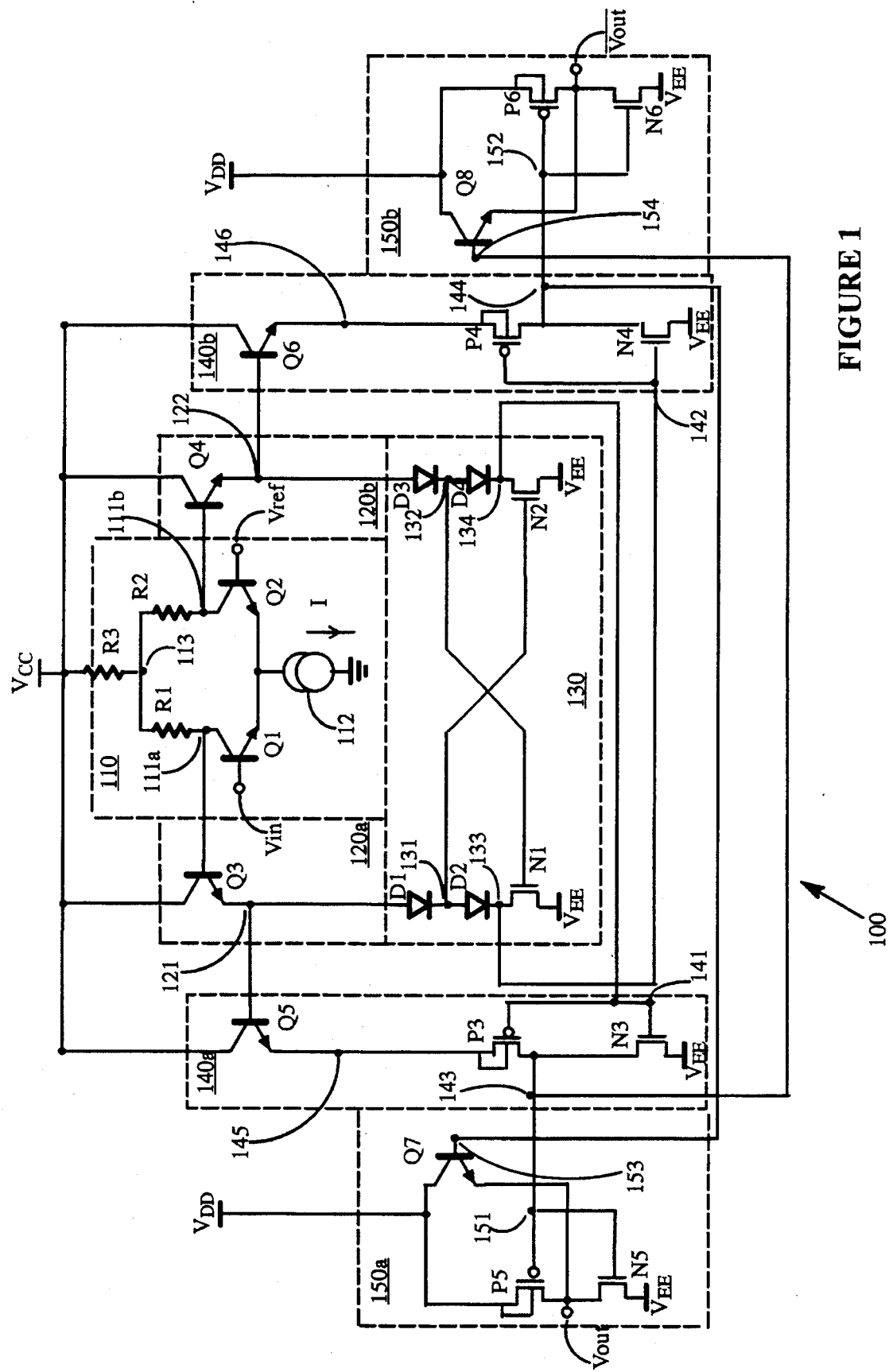
FIGS. 1, 2 and 3 illustrate three embodiments of a circuit for converting ECL voltage levels to CMOS voltage levels on a BiCMOS integrated circuit in accordance with the present invention.

Referring to FIG. 1, an ECL to CMOS converter 100 of the present invention is shown. Converter 100 comprises an ECL differential amplifier 110, a pair of emitter follower stages 120a, 120b, a cross-coupled regenerative pull-down stage 130, a pair of inverter stages 140a, 140b and a pair of output driver stages 150a, 150b. Converter 100 is symmetrical in that the complementary output nodes 111a, 111b of differential amplifier 110 are coupled to stages 120a, 130, 140a and 150a, and complementary stages 120b, 130, 140b and 150b, respectively.

ECL differential amplifier 110 comprises a pair of bipolar NPN transistors Q1, Q2. The base of transistor Q2 is coupled to a reference voltage level, Vref, set to the mid-level of the applicable ECL voltage swing. The base of opposing transistor Q1 is coupled to an input ECL voltage, Vin. The emitters of both transistors Q1 and Q2 are coupled to a common current source 112. The collectors of transistors Q1, Q2 are coupled to load resistors R1, R2, and output nodes 111a, 111b, respectively. A common load resistor R3 is coupled between $V_{CC}$ and node 113. Load resistors R1, R2 are also coupled to common load resistor R3 at node 113. In one embodiment, current source 112 includes an NPN bipolar transistor (not shown) coupled in series with a load resistor (not shown), with the base of the NPN transistor coupled to a reference voltage.

The next stages of converter 100 are emitter follower stages 120a, 120b. Output nodes 111a, 111b of differential amplifier 110 are coupled to the bases of NPN transistors Q3, Q4, respectively, of emitter follower stages 120a, 120b. The collectors of both transistors Q3 and Q4 are coupled to $V_{CC}$. The emitters of transistors Q3, Q4 are coupled to output nodes 121, 122, respectively.

Regenerative pull-down stage 130 includes diode pair D1, D2, diode pair D3, D4 and N-channel field effect transistors (FETs) N1, N2. Output node 121 of emitter follower stage 120a is coupled in series to diode pair D1, D2 and YET N1. The drain of YET N1 is coupled to diode D2 and the source is coupled to ground ($V_{EE}$). Similarly, output node 122 of emitter follower stage 120b is coupled in series to diode pair D3, D4 and YET N2. The drain of YET N2 is coupled to diode D4 and the source is coupled to $V_{EE}$. In addition, the gates of FETs N1, N2 are crossed coupled to nodes 132, 131 intermediate diode pairs D1, D2 and D3, D4, respectively.

Figure 2:
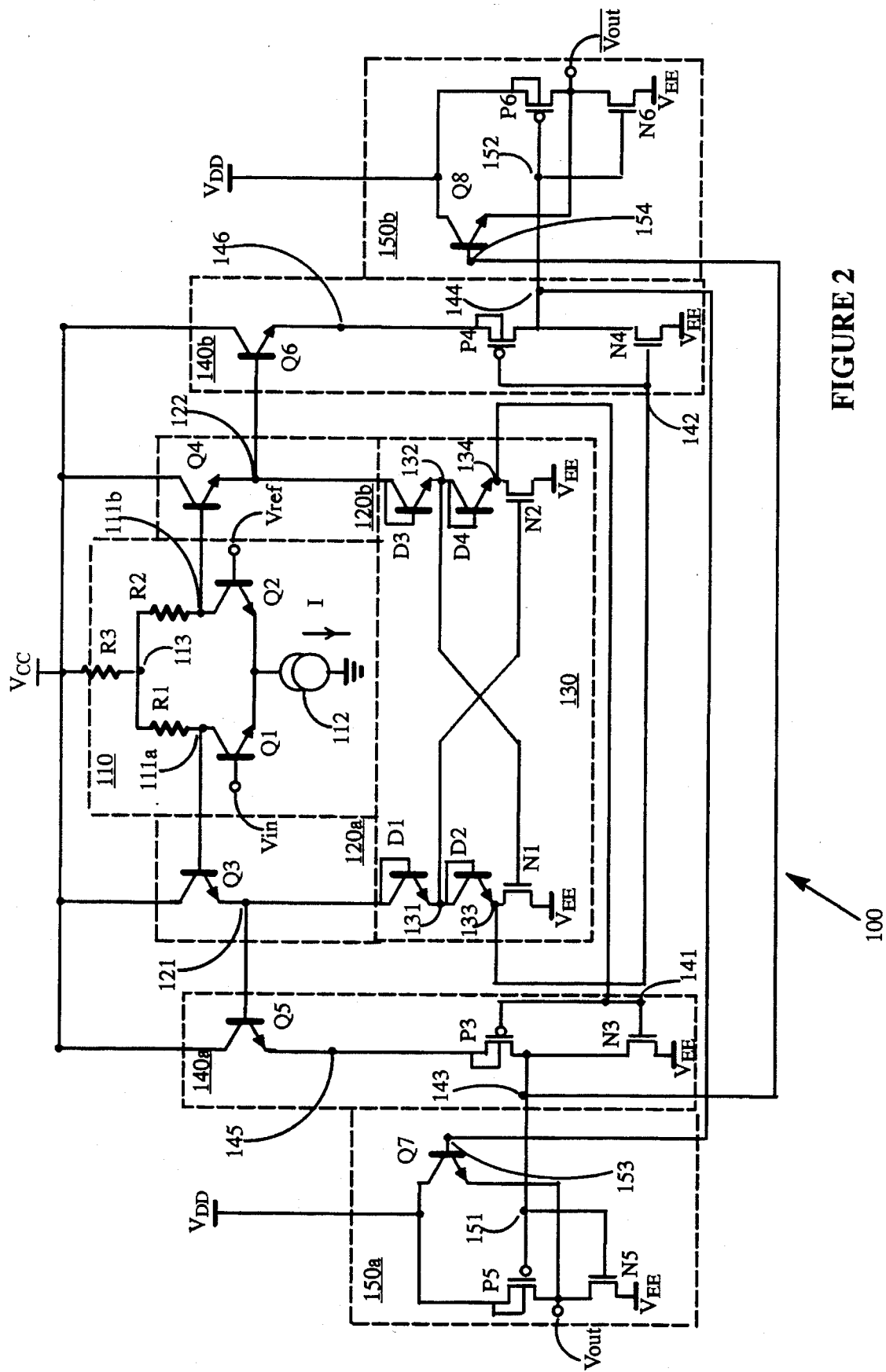

In some embodiments, diodes D1, D2, D3 and D4 are fabricated from bipolar NPN transistors with their respective collectors and bases coupled together as shown in FIG. 2. In other embodiments, depending on the upper voltage limits desired at output nodes 133 and 134, diode pairs D1, D2, and D3, D4 may be replaced by resistors or single diodes, or combinations thereof.

Inverter stages 140a, 140b include transistors Q5, P3, N3, and transistors Q6, P4, N4, respectively. NPN transistor Q6, PMOS FET P4 and NMOS FET N4 of inverter stage 140b are coupled in series between $V_{CC}$ and $V_{EE}$. Output nodes 122, 133 of emitter follower stage 120b and regenerative pull-down stage 130 are coupled to the base of transistor Q6 and node 142, respectively. Node 142 is coupled to the gates of both FETs P4 and N4. The collector of Q6 is coupled to $V_{CC}$ and the emitter is coupled to the source of FET P4. The drain of FET P4 is coupled to the drain of FET N4. Finally, the source of FET N4 is coupled to $V_{EE}$, thereby completing a totem pole structure of inverter stage 140b between $V_{CC}$ and $V_{EE}$.

Similarly, NPN transistor Q5, PMOS FET P3 and NMOS FET N3 of inverter stage 140a are coupled in series between $V_{CC}$ and $V_{EE}$. Output nodes 121, 134 of emitter follower stage 120a and pull-down circuit 130 are coupled to the base of transistor Q5 and node 141, respectively. Node 141 is coupled to the gates of both FETs P3 and N3. The collector of transistor Q5 is coupled to $V_{CC}$ and the emitter is coupled to the source of FET P3. The source of FET N3 is coupled to $V_{EE}$, thereby forming a complementary totem pole structure between $V_{CC}$ and $V_{EE}$.

The last stages of converter 100 are complementary output driver stages 150a, 150b. Output driver stage 150a includes NPN transistor Q7 and CMOS FET inverter pair P5, N5. Output nodes 143, 144 of inverter stages 140a, 140b are coupled to input nodes 151, 153 of driver 150a, respectively. Nodes 151 is coupled to the gates of FET pair P5, N5. Node 153 is coupled to the base of transistor Q7. In some embodiments, collector and emitter of transistor Q7 are coupled to a second supply voltage $V_{DD}$ and output node Vout, respectively. The source-drain channel paths of CMOS inverter pair P5, N5 are coupled in series between $V_{DD}$ and $V_{EE}$. Output node Vout is coupled between FETs P5 and N5.

Similarly, output driver stage 150b includes NPN transistor Q8 and CMOS FET inverter pair P6, N6. Output nodes 144, 143 of inverters 140b, 140a are coupled to input nodes 152, 154 of driver 150b, respectively. Nodes 152 is coupled to the gates of FET pair P6, M6. Node 154 is coupled to the base of transistor Q8. The collector and emitter of transistor Q8 are coupled to $V_{DD}$ and output node Vout, respectively. The source-drain channel paths of CMOS inverter pair P6, N6 are coupled in series between $V_{DD}$ and $V_{EE}$. Output node $\overline{\text{Vout}}$ is coupled between FETs P6 and N6.

The operation of converter 100 is illustrated by a description of a transition of converter 100 from a first stable state, i.e., when Vin is less than Vref, to a second stable state, i.e., when Vin is greater than Vref. Note that in both stable states, there is sufficient voltage drops across the respective base-emitter junctions of transistors Q3, Q4 and the respective forward biased diode junctions of diodes D1, D2, D3, D4, to ensure that transistors Q3, Q4 and and diodes D1, D2, D3 and D4 remain at least partially on, regardless of the state of converter 100.

In the first stable state, Vin is less than Vref. Since the base voltage of transistor Q1 is less than the base voltage of transistor Q2, transistor Q1 is off and transistor Q2 is on. As a result, current is directed through resistors R2, R3 and not resistor R1, causing node 111a to be pulled down relative to node 111b.

The resistance of resistors R1, R2 and R3 and the mount of current drawn by current source 112 determine the high and low voltage levels of nodes 111a and 111b. The low voltage level at node 111b is high enough to ensure that there is a sufficient voltage drop across the base-emitter junction of transistor Q4 of emitter follower 120b, enabling transistor Q4 to stay at least partially on. In addition, resistor R3 also serves to ensure that when transistor Q1 is off, the voltage at output node 111a of differential amplifier 110 does not rise all the way to $V_{CC}$. Instead, node 111a is pulled up to the predetermined upper voltage limit, which is less than $V_{CC}$. According to different embodiments, the value of R3 may vary depending on the upper voltage limit desired at node 111a. This aspect of the invention advantageously protects transistor P3 of stage 140a, by preventing excessive voltage from appearing across its source to gate junctions.

The high voltage level of node 111a permits transistor Q3 to be fully on. Since transistor Q3 is coupled in series with FET N1, and FET N1 is partially on, the current through transistor Q3, diodes D1, D2 is restricted but sufficient to maintain the base-emitter and cathode voltage drops across transistor Q3 and diodes D1, D2. The high voltage level at node 111a results in corresponding high voltage levels at node 121, node 131 and node 133. The high level of node 131, coupled to the gate of FET N2, keeps FET N2 fully on.

Although node 111b is at the low voltage level, node 111b is sufficiently high enough so that transistor Q4 remains on in spite of the voltage drops across the base-emitter and cathode-anode of transistor Q4 and diodes D3, D4, respectively, thereby allowing transistor Q4 and diodes D3, D4 to remain fully on. Flit N2 is kept fully on by control node 131. Accordingly, a current path is established between $V_{CC}$, through transistor Q4, diodes D3, D4 and FET N2. It should be noted that the voltage at node 132 is sufficient to maintain N1 partially on.

The values of load resistors R1, R2, R3 and the total number of transistor(s) base-emitter and diode(s) cathode-anode voltage drops in emitter follower stages 120a, 120b and regenerative pull-down stage 130 define both the amount of voltage level shifting and the operating voltage ranges at nodes 121, 122, 133 and 134. The operating voltage ranges at nodes 121, 122, 133, and 134 are selected so that the current consumption of regenerative pull-down stage 130 is optimized with respect to its switching speed.

The voltage at output node 122 of emitter follower stage 120b is then fed into the base of transistor Q6 of inverter stage 140b. Since input node 142 of inverter stage 140b is coupled to node 133 which is high, FET P4 is off and FET N4 is on. With FET P4 off, output node 144 is isolated from node 146. FET N4 is on, thereby coupling output node 144 of inverter stage 140b to $V_{EE}$.

The voltage at node 121 of emitter follower stage 120a is provided to the base of Q5 of emitter follower stage 140a. Node 134 which is low, is coupled to input node 141 of inverter stage 140a and causes PMOS FET P3 to be on and NMOS FET N3 to be off. With FET N3 off, output node 143 is isolated from $V_{EE}$. FET P3 is on, allowing transistor Q5 to conduct current freely. As a result, output node 143 of inverter stage 140a is at a high voltage level, approximately two base-emitter voltage drops below the voltage of node 111a.

Note that inverter stages 140a and 140b are symmetrical and provide high and low voltage levels via output nodes 143, 144, respectively, for controlling both output driver stages 150a, 150b. The availability of complementary levels at output nodes 143, 144 advantageously eliminates the need for additional inverters for driving output driver stages 150a, 150b. The complementary voltage levels of inverter stages 140a, 140b are required for driving transistor Q7 and FETs P5, M5 of output driver stage 150a, respectively. The same complementary voltage levels are also required for driving transistor Q8 and FETs P6, N6 of complementary output driver stage 150b, respectively.

Base 154 of transistor Q8 of output driver stage 150b is coupled to node 143 which is high, causing transistor Q8 to be on. In contrast, node 152, coupled to node 144, is low, thereby causing FET P6 to be on and FET N6 to be off. As a result, output node $\overline{Vout}$ is isolated from $V_{EE}$, and transistor Q8 together with FET P6 pull output node $\overline{Vout}$ up to $V_{DD}$.

Conversely, base 153 of transistor Q7, coupled to node 144, is low, causing transistor Q7 to be off. In contrast, node 151, coupled to node 143, is high, thereby causing FET P5 to be off and FET N5 to be on. As a result, FET N5 pulls output node Vout down to $V_{EE}$.

Since converter 100 is symmetrical, the above-described transition of converter 100 from the first stable state to the second stable state, i.e., Vin>Vref, is equally applicable to a transition of converter 100 from the second stable state back to the first stable state when Vin<Vref, by merely interchanging the voltages at each corresponding (symmetrical) node of each corresponding stage.

In one embodiment, resistors R1, R2 and R3 are 5000, 5000, and 800 Ohms, respectively, with current source 112 drawing 400uA. Supply voltages $V_{CC}$, $V_{DD}$, and $V_{EE}$ are 5.0, 3.3, and 0 volts, respectively. As a result, a static current of 400uA flows through the fully on transistors Q3, N1 diode pair D1, D2 when node 111a is in the low state, while a static current of 200uA flows through the partially on transistors Q4, N2 and diode pair D3, D4 when node 111b is in the high state, and vice versa. In addition, diodes D1, D2, D3 and D4 may be fabricated using NPN transistors with their respective bases and collectors coupled together.

In this embodiment, the fan-out capability of driver stage 150b is enhanced by increasing its current driving capability. Sufficient fan-out is necessary for applications such as driving word lines or bit lines in a memory array. Increased fan-out capability is provided by transistor Q8, coupled between $V_{DD}$ and output node $\overline{Vout}$ of converter 100, which provides a high current capacity path from $V_{DD}$ to $\overline{Vout}$. This is because bipolar transistor Q8 is capable of carrying higher currents than FET P6.

Figure 3:
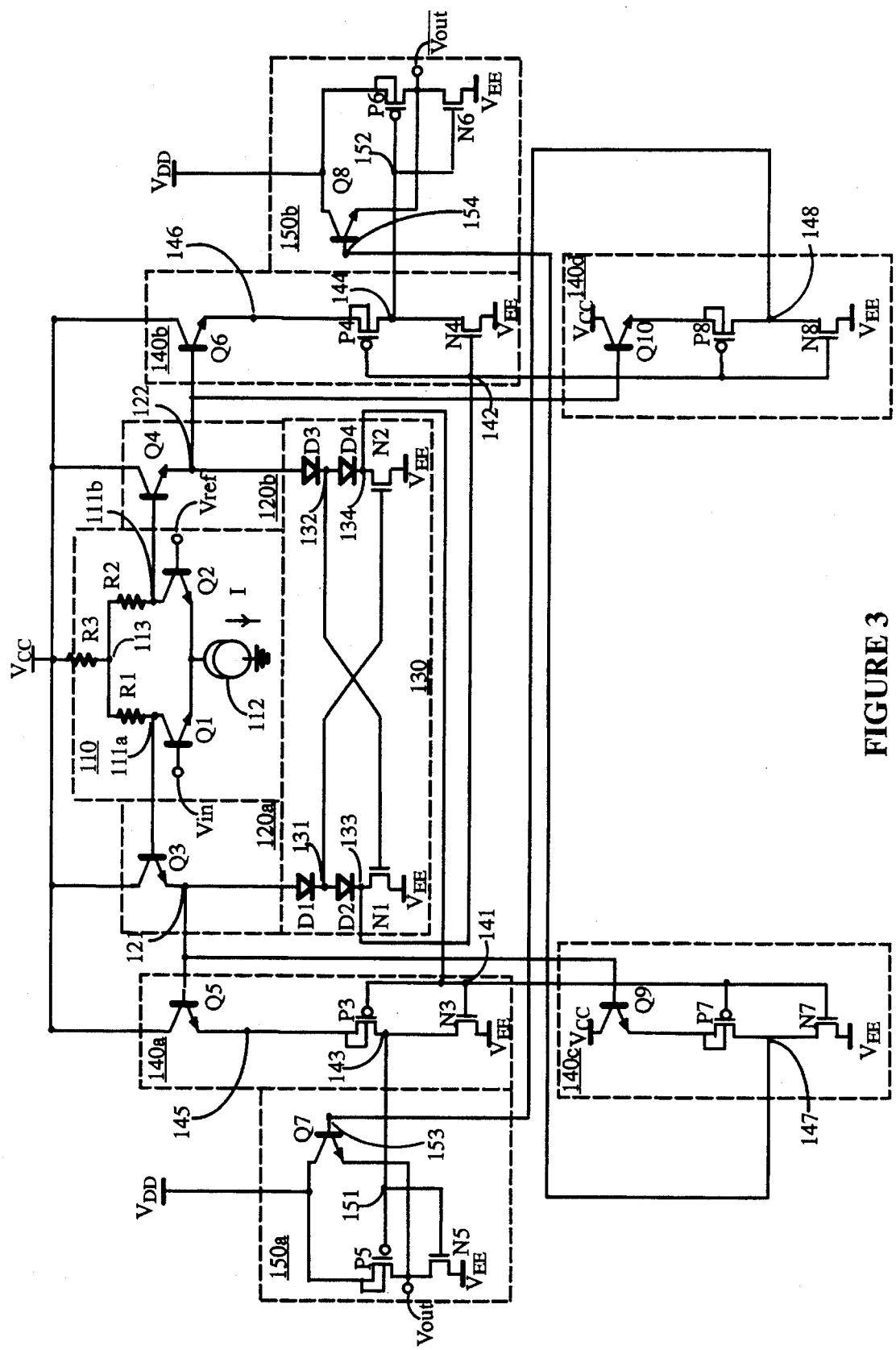

In some embodiment as shown in FIG. 3, speed and, hence, the current driving capability of inverter stages 140a, 140b is an important consideration. As such, both inverter stages 140a, 140b are duplicated, thereby forming a second identical pair of inverter stages which provides a corresponding pair of complementary output nodes for driving output driver stages 150a, 150b, respectively. In other words, inverter stages 140a and 140b are dedicated to output driver stage 150a while duplicates (not shown) of inverters 140a and 140b are dedicated to output driver stage 150b.

The average translation speed of this embodiment of logic converter 100 is in the range of 0.6 to 1.2 nanoseconds for 0.5pF loads on both Vout and $\overline{Vout}$, representing a significant speed improvement over the known prior art converters, without a significant increase in current consumption or circuit complexity.

In some embodiments, modifications apparent to those skilled in the art are are made to converter 100. For instance $V_{CC}$ and $V_{DD}$ can be at the same voltage level, e.g. 3.3 volts. Other possible modifications include eliminating resistor R3 and diodes D1, D3, and coupling the bases of transistors Q5, Q6 to nodes 111a and 111b, respectively. Hence, converter 100 is easily adaptable to other BiCMOS circuits having different supply voltage ranges for $V_{CC}$ and/or $V_{DD}$.

Although this invention has been described using specific embodiments, other embodiments, alternatives and modifications will be apparent to those skilled in the art without deviating from the scope and spirit of the invention. Hence, the above description is merely illustrative and not intended to be limiting. The mac scope of the invention is indicated by the following claims.

What is claimed is:

1. A logic converter comprising:

a differential amplifier for receiving and differentially amplifying an input signal, said differential amplifier having a differential input node coupled to said input signal, said differential amplifier producing a first pair of complementary intermediate signals on a first and second output node, respectively, in response to said input signal;

a regenerative stage coupled to said first and second output nodes of said differential amplifier, said regenerative stage having a fast and a second pull-down portion for generating a second pair of complementary intermediate signals on corresponding first and second output nodes by switching between a partially on state and a fully on state in response to said fast pair of complementary intermediate signal; and a first inverter stage having a first input node coupled to said first output node of said differential amplifier, and a second input node coupled to said second output node of said regenerative stage, and wherein said first inverter stage provides a third intermediate signal in response to said first pair of complementary intermediate signals and said second pair of complementary intermediate signal.

2. The logic converter of claim 1 wherein said first and second pull-down portions include a first and a second transistor, respectively, each said transistor having a control node.

3. The logic converter of claim 2 wherein said first and second pull-down portions further include a first and a second pair of dimes, respectively, and wherein said first pair of dimes is coupled in series between said input stage and said first transistor, said second pair of dimes is coupled in series between said input stage and said second transistor, said control node of said first transistor is coupled to a junction of said second pair of diodes, and said control node of said second transistor is coupled to a junction of said first pair of diodes.

4. The logic converter of claim 3 wherein said dimes of said first and second pull-down portions are bipolar transistors with the respective base and collector junctions of each bipolar transistor coupled together.

5. The logic converter of claim 1 further comprising an output driver stage coupled to said regenerative stage, said output driver stage having an inverter coupled between $V_{DD}$ and $V_{EE}$, and a bipolar transistor coupled between $V_{DD}$ and an output node of said converter.

6. The logic converter of claim 5 wherein said inverter includes a PMOS transistor and an NMOS transistor.

7. The logic converter of claim 1 further comprising:

a second inverter stage having a first input node coupled to said second output node of said differential amplifier, and a second input node coupled to said first output node of said regenerative stage, and wherein said second inverter stage provides a third complementary intermediate signal in response to said first complementary intermediate signal and said second intermediate signal.

8. The logic converter of claim 7 further comprising:

a third inverter stage having a first input node coupled to said differential amplifier, and a second input node coupled to said second output node of said regenerative stage, and wherein said third inverter stage provides a fourth intermediate signal in response to said first intermediate signal and said second complementary intermediate signal; and a fourth inverter stage having a first input node coupled to said differential amplifier, and a second input node coupled to said first output node of said regenerative stage, and wherein said fourth inverter stage provides a fourth complementary intermediate signal in response to said first complementary intermediate signal and said second intermediate signal.

9. The logic converter of claim 8 further comprising:

a first output driver stage coupled to said first and second inverter stages for generating a first output signal in response to said third intermediate and third complementary intermediate signals; and a second output driver stage coupled to said third and fourth inverter stages for generating a second output signal in response to said fourth intermediate and fourth complementary intermediate signals.

10. The logic converter of claim 9 wherein each said first and second output driver stages include an inverter coupled between $V_{DD}$ and $V_{EE}$, and a bipolar transistor coupled between $V_{CC}$ and an output node of said converter.

11. The logic converter of claim 8 wherein each said inverter include a PMOS transistor and an NMOS transistor.

12. The logic converter of claim 1 wherein said input signal is an ECL signal.

13. The logic converter of claim 1 wherein said differential amplifier includes a first and second bipolar transistor, a first and second load resistor and a common load resistor, and wherein the emitters of said first and second bipolar transistors are coupled to a common current source, said first load resistor is coupled between the collector of said first bipolar transistor and said common load resistor, said second load resistor is coupled between the collector of said second bipolar transistor and said common load resistor, and said common load resistor is coupled to a voltage source.

14. The logic converter of claim 1 wherein said input signal is an ECL signal and said output signal is a CMOS signal.

15. A logic converter comprising:

a differential amplifier for receiving and differentially amplifying an input signal, said differential amplifier having a first differential input node coupled to said input signal, and a second differential input node coupled to a reference voltage source;

a first emitter follower coupled to a first output node of said differential amplifier, said first emitter follower producing a first intermediate signal in response to said input signal;

a second emitter follower coupled to a second output node of said differential amplifier, said second emitter follower producing a first complementary intermediate signal in response to said input signal;

a regenerative stage coupled to said first and second emitter followers, said regenerative stage having a first and a second pull-down portion for generating a second pair of complementary, intermediate signals on corresponding first and second output nodes by switching between a partially on state and a fully on state in response to said first intermediate signal and said first complementary, intermediate signal;

a first inverter stage having a first input node coupled to said first emitter follower, and a second input node coupled to said second output node of said regenerative stage, and wherein said first inverter stage provides a third intermediate signal in response to said first intermediate signal and said second complementary intermediate signal;

a second inverter stage having a first input node coupled to said second emitter follower, and a second input node coupled to said first output node of said regenerative stage, and wherein said second inverter stage provides a third complementary intermediate signal in response to said first complementary intermediate signal and said second intermediate signal;

a first output driver stage coupled to said first and second inverter stages for generating a first output signal in response to said third intermediate and said third complementary intermediate signals; and a second output driver stage coupled to said first and second inverter stages for generating a second output signal in response to said third intermediate and said third complementary intermediate signals.

16. The logic converter of claim 15 wherein each said first and second output driver stages include an inverter coupled between $V_{DD}$ and $V_{EE}$, and a bipolar transistor coupled between $V_{DD}$ and an output node of said converter.

17. The logic converter of claim 16 wherein each said inverter include a PMOS transistor and an NMOS transistor.

18. The logic converter of claim 15 wherein each of said first and second inverter comprises:

a bipolar transistor whose collector is coupled to $V_{CC}$;

said first input node coupled to the base of said bipolar transistor, a CMOS inverter coupled between the emitter of said bipolar transistor and $V_{EE}$;

said second input node coupled to the input node of said CMOS inverter; and an output node coupled to the output node of said CMOS inverter.

19. The logic converter of claim 18 wherein said CMOS inverter includes a PMOS transistor and an NMOS transistor.

* * * * *